(12) United States Patent
Wu et al.

(10) Patent No.: US 12,028,063 B2
(45) Date of Patent: Jul. 2, 2024

(54) INPUT DEVICE CONTROL WHEEL

(71) Applicant: Primax Electronics Ltd., Taipei (TW)

(72) Inventors: Chun-Che Wu, Taipei (TW);
Ming-Hao Hsieh, Taipei (TW);
Sheng-An Tsai, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 51 days.

(21) Appl. No.: 17/857,852

(22) Filed: Jul. 5, 2022

(65) Prior Publication Data

US 2023/0216499 A1    Jul. 6, 2023

Related U.S. Application Data

(60) Provisional application No. 63/296,397, filed on Jan. 4, 2022.

(51) Int. Cl.
| | | |
|---|---|---|
| *H03K 17/97* | (2006.01) | |
| *H01H 19/14* | (2006.01) | |
| *H01H 36/00* | (2006.01) | |

(52) U.S. Cl.
CPC ............. *H03K 17/97* (2013.01); *H01H 19/14* (2013.01); *H01H 36/0073* (2013.01); *H03K 2217/94068* (2013.01)

(58) Field of Classification Search
None
See application file for complete search history.

(56) References Cited

U.S. PATENT DOCUMENTS

| | | | | |
|---|---|---|---|---|
| 6,812,816 B1* | 11/2004 | Easton | ................... | G01D 5/145 335/207 |
| 11,625,112 B1* | 4/2023 | Pan | ....................... | G06F 3/0312 345/167 |
| 2010/0164908 A1* | 7/2010 | Hill | ........................ | G06F 3/0362 345/184 |
| 2012/0267221 A1* | 10/2012 | Gohng | .................. | G06F 3/0338 200/61.54 |
| 2015/0041289 A1* | 2/2015 | Ely | ........................ | H01H 3/122 200/4 |

\* cited by examiner

*Primary Examiner* — Bernard Rojas
(74) *Attorney, Agent, or Firm* — KIRTON McCONKIE; Evan R. Witt (57) ABSTRACT

A control wheel includes a casing, a wheel ring, a first magnetic element, a pivotal shaft and a second magnetic element. The casing includes an accommodation structure and a concave structure. The accommodation structure includes a base. The wheel ring is disposed within the accommodation structure. The wheel ring is exposed outside through the accommodation structure and the concave structure. The pivotal shaft is disposed within the wheel ring and connected with the base of the accommodation structure. The wheel ring is rotatable relative to the pivotal shaft. The first magnetic element is disposed within the wheel ring. The second magnetic element is disposed within the base of the accommodation structure. The first magnetic element of the wheel ring and the second magnetic element are magnetically attracted by each other. Consequently, a rotating speed of the wheel ring is decreased.

9 Claims, 7 Drawing Sheets

FIG.7

INPUT DEVICE CONTROL WHEEL

CROSS-REFERENCE TO RELATED APPLICATION

This application claims priority to U.S. Provisional Patent Application No. 63/296,397 filed Jan. 4, 2022, the contents of which are incorporated herein by reference.

FIELD OF THE INVENTION

The present invention relates to an input device, and more particularly to a control wheel.

BACKGROUND OF THE INVENTION

Conventionally, a control wheel of a remote controller is installed within an inner space of the remote controller. In addition, an operating surface of the control wheel is exposed. Consequently, the user's finger can be slid on the operating surface of the control wheel to operate the remote controller. When the remote controller is taken and used by the user in the air, the inclination angle of the remote controller in the air is changed or the remote controller is shaken in the air. In case that the remote controller is inclined, the control wheel is possibly shifted or shaken. For avoiding the above problems, the remote controller is additionally equipped with a damping structure between the control wheel and the main body of the control wheel. Due to the arrangement of the damping structure, the friction between the control wheel and the main body of the control wheel is increased. The increased friction can decrease the rotating speed of the control wheel. Moreover, the increased friction can prevent the control wheel from the self-rotating action or the shifting action during the use of the remote controller or avoid the erroneous touch.

However, the conventional damping structure for the conventional control wheel still has some drawbacks. For example, the damping structure for the conventional control wheel is usually a soft rubber gasket or a protrusion structure. The control wheel rubs against the main body of the remote controller through the soft rubber gasket or the protrusion structure by physical friction. Consequently, friction resistance is generated to control or decrease the rotating speed of the control wheel. However, the physical friction may damage the structures of associated components after a long use time and adversely affect the rotating precision of the control wheel.

SUMMARY OF THE INVENTION

For solving the drawbacks of the conventional technologies, the present invention provides a control wheel for a remote controller. The rotating speed of the control wheel is controlled according to a magnetic attraction technology. Since the control wheel does not directly rub against the main body of the remote controller, the structures of associated components are not damaged. When the remote controller is inclined, the control wheel is magnetically attracted. Consequently, the rotating function of the control wheel is maintained, and the rotating precision of the control wheel is enhanced. Moreover, the lateral surface of the control wheel is exposed outside through a concave structure. Consequently, the user can not only touch the front surface of the control wheel to operate the control wheel but also touch the lateral surface of the control wheel to control the control wheel more easily.

In accordance with an aspect of the present invention, a control wheel is provided. The control wheel includes a casing, a wheel ring, a pivotal shaft and a second magnetic element. The casing includes an accommodation structure and a concave structure. The accommodation structure and the concave structure are located adjacent to each other. The accommodation structure includes a base. The wheel ring is disposed within the accommodation structure. The wheel ring includes a top surface, a lateral surface and a first magnetic element. The lateral surface is arranged around the top surface and exposed outside through the concave structure of the casing. The first magnetic element is disposed within the wheel ring. The pivotal shaft is disposed within the wheel ring and connected with the base of the accommodation structure. The wheel ring is rotatable relative to the pivotal shaft. The second magnetic element is disposed within the base of the accommodation structure. The lateral surface of the wheel ring is exposed outside through the concave structure of the casing. The first magnetic element of the wheel ring and the second magnetic element are magnetically attracted by each other. Consequently, a rotating speed of the wheel ring is decreased.

In an embodiment, the accommodation structure of the casing further includes a first opening. The top surface of the wheel ring is aligned with the first opening. The top surface of the wheel ring is exposed outside through the first opening.

In an embodiment, the concave structure of the casing includes a second opening. The lateral surface of the wheel ring is aligned with the second opening. The lateral surface of the wheel ring is exposed outside through the second opening.

In an embodiment, the wheel ring further includes a support part. The support part is disposed within the wheel ring. The first magnetic element is disposed within the support part.

In an embodiment, the support part includes an annular groove, and the first magnetic element is disposed within the annular groove.

In an embodiment, a recess is formed in the base of the accommodation structure, and the second magnetic element is disposed within the recess.

In an embodiment, the wheel ring further includes a bottom surface and an annular track. The bottom surface of the wheel ring is aligned with the base of the accommodation structure. The annular track of the wheel ring is disposed on the bottom surface.

In an embodiment, the accommodation structure further includes a resilience element. The resilience element is disposed on the base of the accommodation structure and protruded in a direction toward the wheel ring.

In an embodiment, the accommodation structure further includes a covering plate. The covering plate is disposed on the base of the accommodation structure. The second magnetic element is covered by the covering plate.

In an embodiment, the covering plate of the accommodation structure further includes a perforation. The perforation is in communication with the base of the accommodation structure and the wheel ring.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
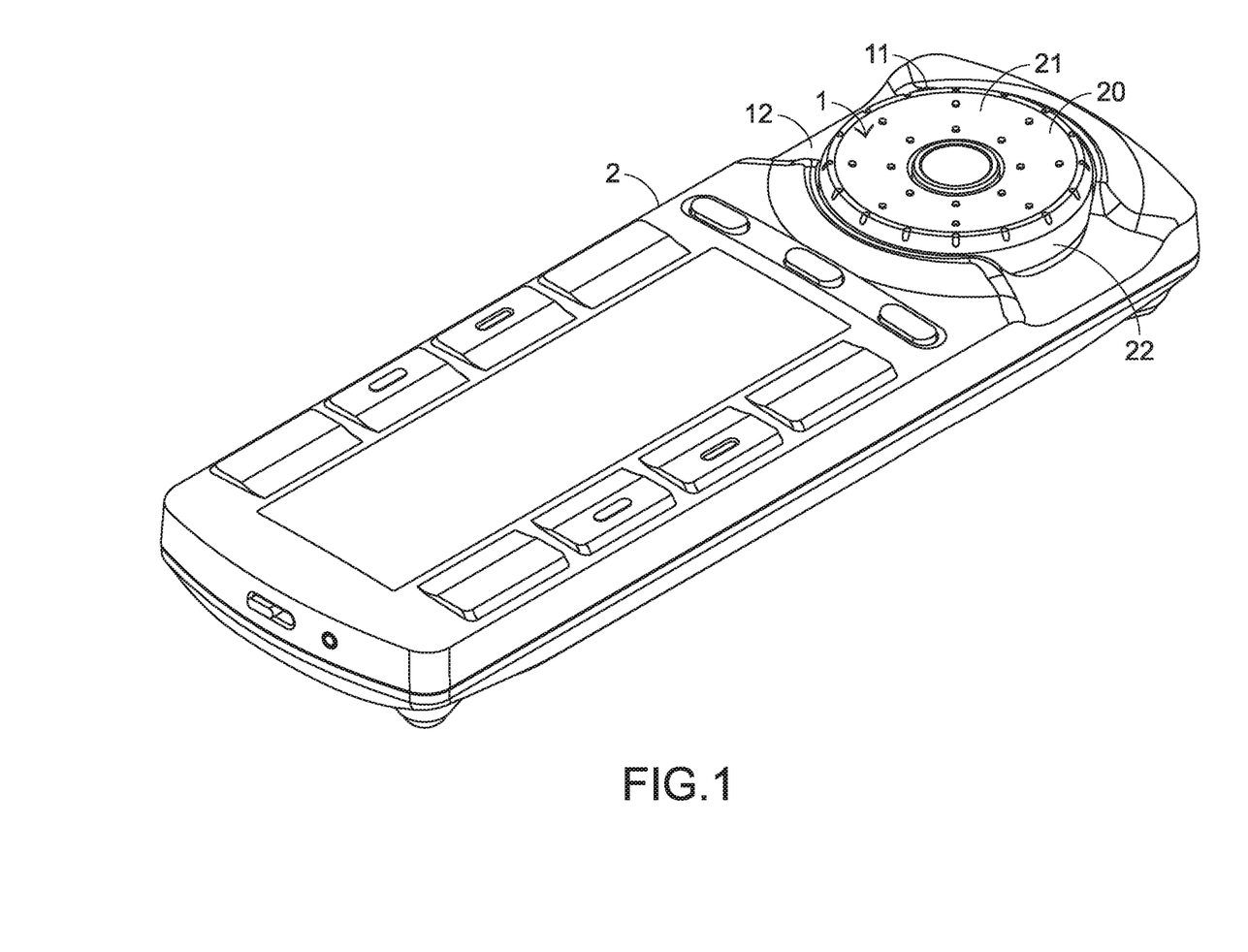
FIG. 1 is a schematic perspective view illustrating a remote controller and a control wheel according to a first embodiment of the present invention.
Figure 2:
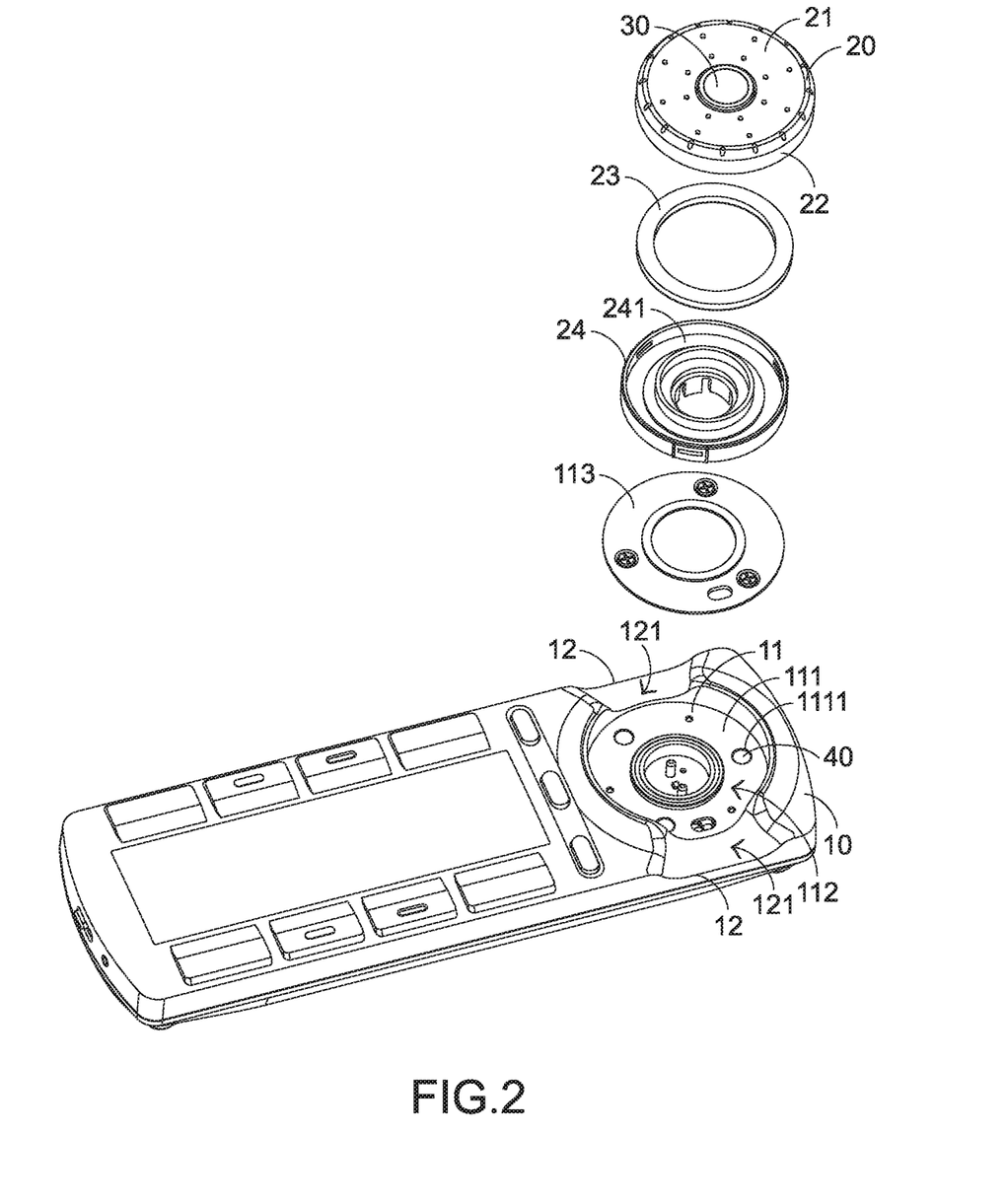
FIG. 2 is a schematic exploded view illustrating the control wheel according to the first embodiment of the present invention.
Figure 3:
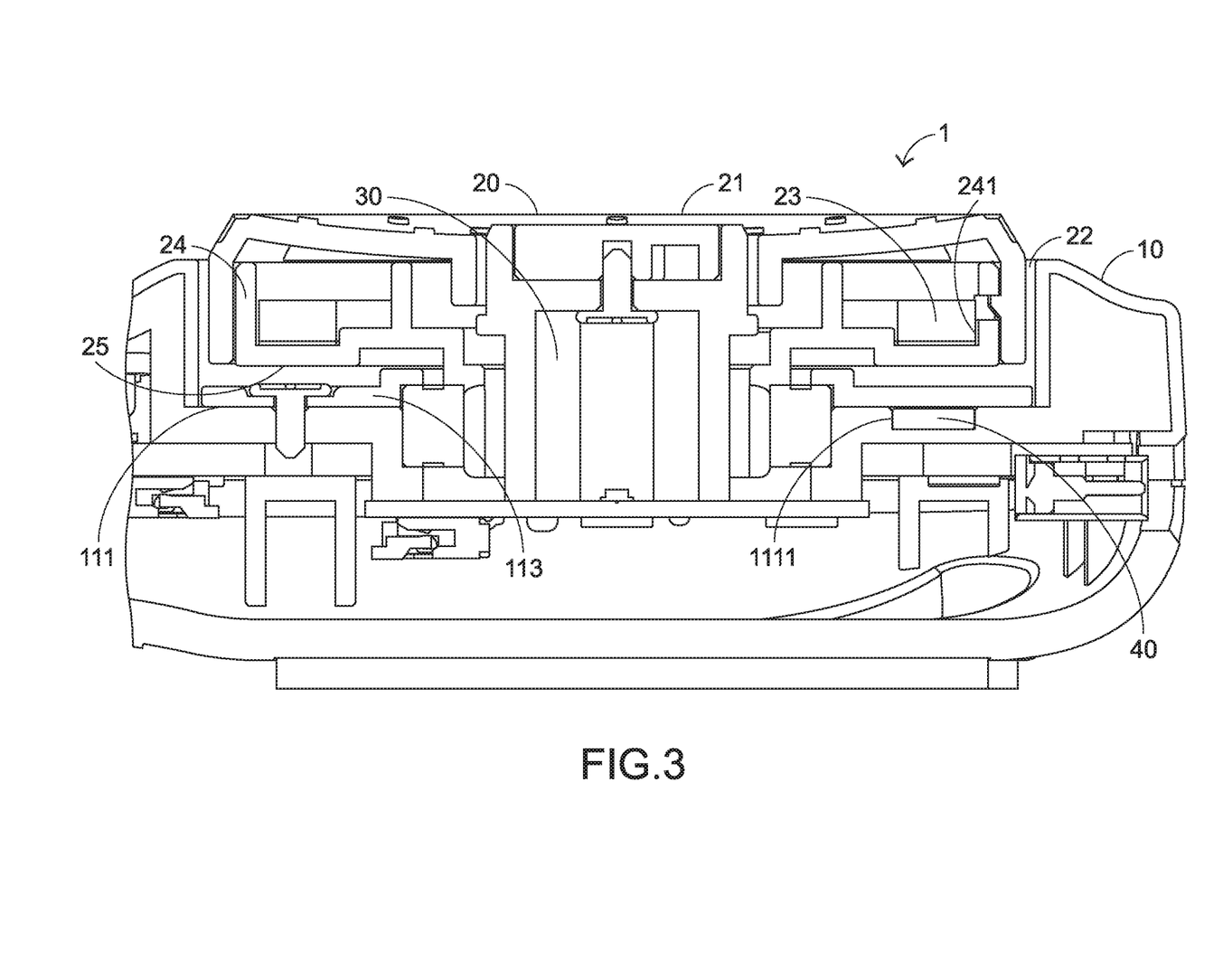
FIG. 3 is a schematic cross-sectional view illustrating the control wheel according to the first embodiment of the present invention.

FIG. 1 is a schematic perspective view illustrating a remote controller and a control wheel according to a first embodiment of the present invention. FIG. 2 is a schematic exploded view illustrating the control wheel according to the first embodiment of the present invention. FIG. 3 is a schematic cross-sectional view illustrating the control wheel according to the first embodiment of the present invention. The control wheel 1 is installed in the remote controller 2. In an embodiment, the control wheel 1 comprises a casing 10, a wheel ring 20, a pivotal shaft 30 and a second magnetic element 40.

The casing 10 comprises an accommodation structure 11 and a concave structure 12. The accommodation structure 11 of the casing 10 comprises a base 111, a first opening 112 and a covering plate 113. Moreover, a recess 1111 is formed in the base 111 of the accommodation structure 11. The concave structure 12 of the casing 10 comprises a second opening 121.

The wheel ring 20 comprises a top surface 21, a lateral surface 22, a first magnetic element 23, a support part 24 and a bottom surface 25. The support part 24 of the wheel ring 20 comprises an annular groove 241.

The accommodation structure 11 and the concave structure 12 of the casing 10 are located adjacent to each other. In addition, the first opening 112 of the accommodation structure 11 and the second opening 121 of the concave structure 12 are in communication with each other.

The wheel ring 20 is disposed within the accommodation structure 11. The bottom surface 25 of the wheel ring 20 is aligned with the base 111 of the accommodation structure 11. The pivotal shaft 30 is disposed within the wheel ring 20 and connected with the base 111 of the accommodation structure 11. Consequently, the wheel ring 20 can be rotated relative to the pivotal shaft 30. The lateral surface 22 of the wheel ring 20 is arranged around the top surface 21 of the wheel ring 20. The top surface 21 of the wheel ring 20 is aligned with the first opening 112 of the accommodation structure 11. Moreover, the top surface 21 of the wheel ring 20 is exposed outside through the first opening 112 of the accommodation structure 11. The lateral surface 22 of the wheel ring 20 is aligned with the second opening 121 of the concave structure 12. Moreover, the lateral surface 22 of the wheel ring 20 is exposed outside through the second opening 121 of the concave structure 12. The support part 24 of the wheel ring 20 is disposed within the inner portion of the wheel ring 20. The first magnetic element 23 is disposed within the wheel ring 20. Preferably, the first magnetic element 23 is disposed within the annular groove 241 of the support part 24 of the wheel ring 20.

The second magnetic element 40 is disposed within the recess 1111 of the base 111 of the accommodation structure 11. The covering plate 113 of the accommodation structure 11 is disposed on the base 111 of the accommodation structure 11. Moreover, the second magnetic element 40 is covered by the covering plate 113 of the accommodation structure 11.

The top surface 21 of the wheel ring 20 is exposed outside through the accommodation structure 11. The lateral surface 22 of the wheel ring 20 is exposed outside through the concave structure 12. Moreover, the first magnetic element 23 of the wheel ring 20 and the second magnetic element 40 in the base 111 of the accommodation structure 11 are magnetically attracted by each other. Due to the magnetic force between the first magnetic element 23 and the second magnetic element 40, the rotating speed and the sliding capability of the wheel ring 20 are decreased.

Figure 4:
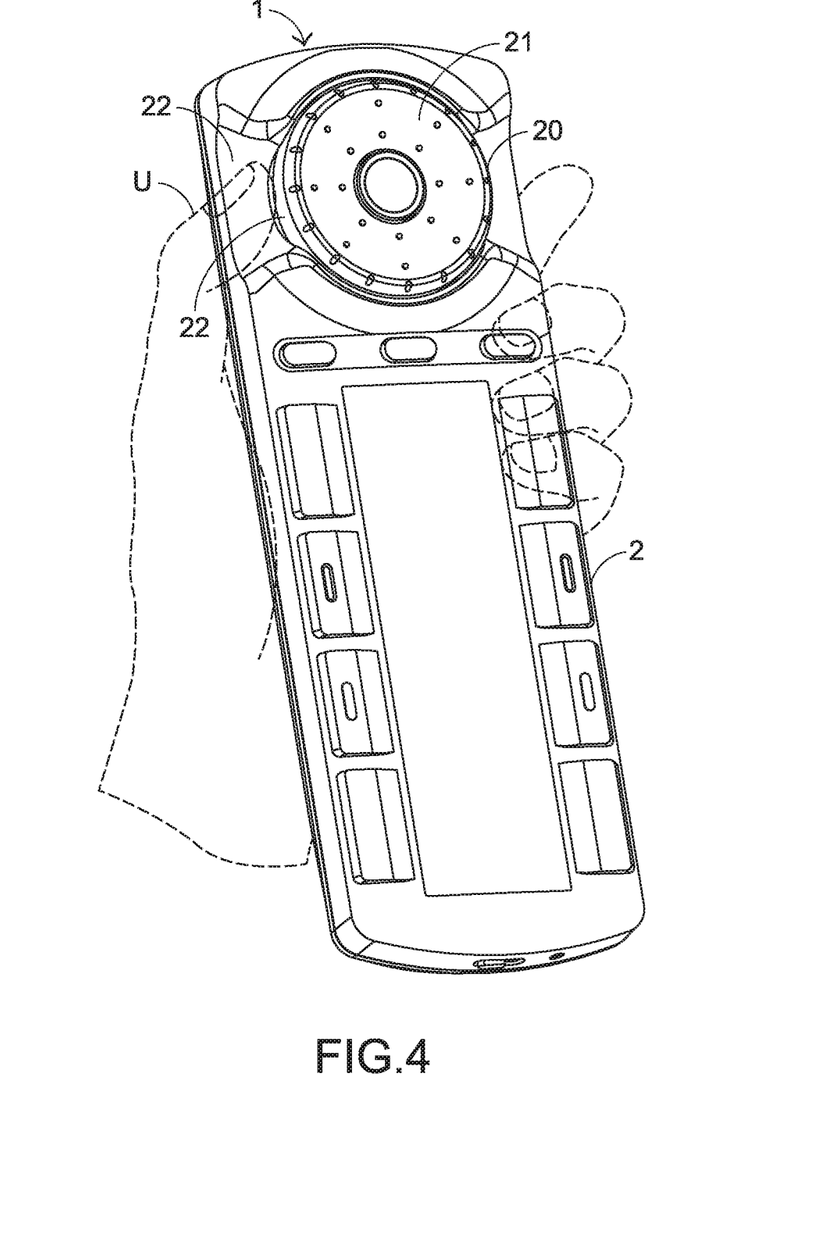
FIG. 4 schematically illustrates a scenario of using the remote controller and the control wheel according to the first embodiment of the present invention.
Figure 5:
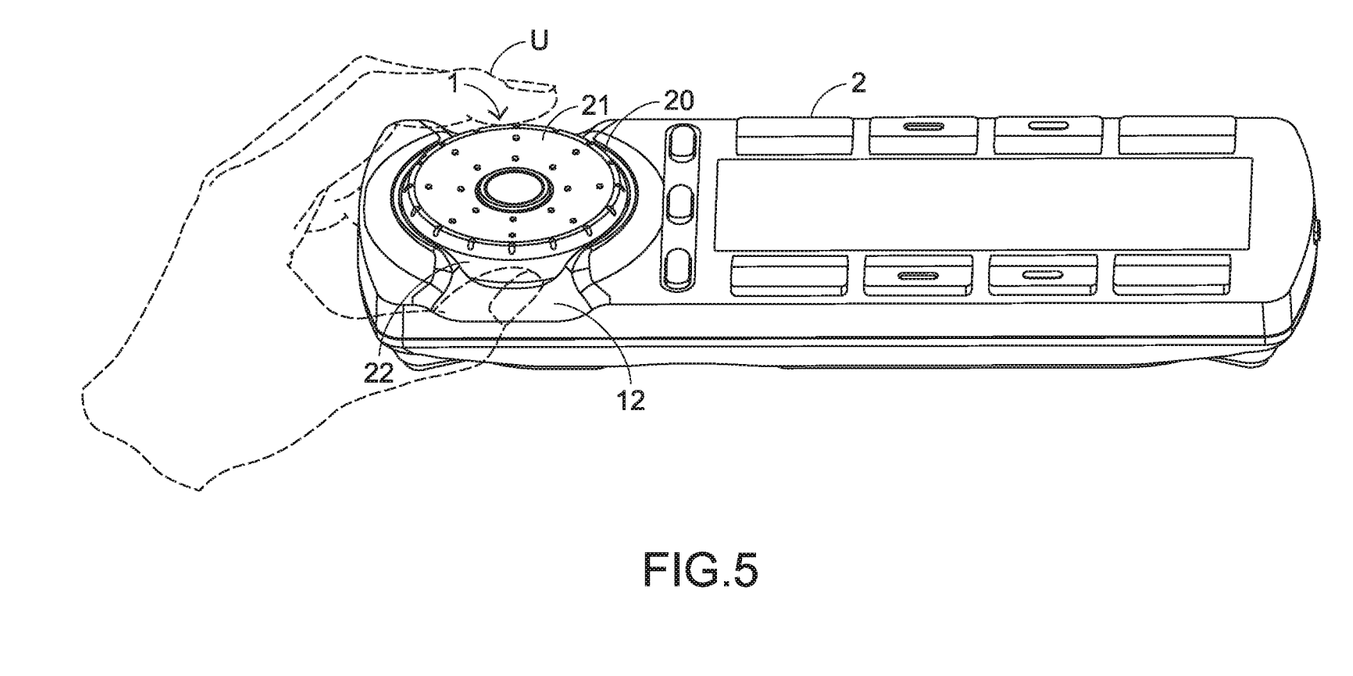
FIG. 5 schematically illustrates another scenario of using the remote controller and the control wheel according to the first embodiment of the present invention.

FIG. 4 schematically illustrates a scenario of using the remote controller and the control wheel according to the first embodiment of the present invention. FIG. 5 schematically illustrates another scenario of using the remote controller and the control wheel according to the first embodiment of the present invention. In the scenario of FIG. 4, the remote controller 2 is held by the user U. Under this circumstance, the finger of the user U can insert into the concave structure 12 of the control wheel 1. Moreover, the finger of the user U can touch the lateral surface 22 of the wheel ring 20 through the concave structure 12 of the control wheel 1. In the scenario of FIG. 5, the remote controller 2 is placed on a horizontal plane. Under this circumstance, the finger of the user U can insert into the concave structure 12 of the control wheel 1 to touch the lateral surface 22 of the wheel ring 20. Moreover, the wheel ring 20 can be freely rotated by the user U from various angles. In addition, the top surface 21 of the wheel ring 20 is continuously exposed outside. Consequently, the user U can freely change the hand gestures to control and rotate the control wheel 1.

Figure 6:
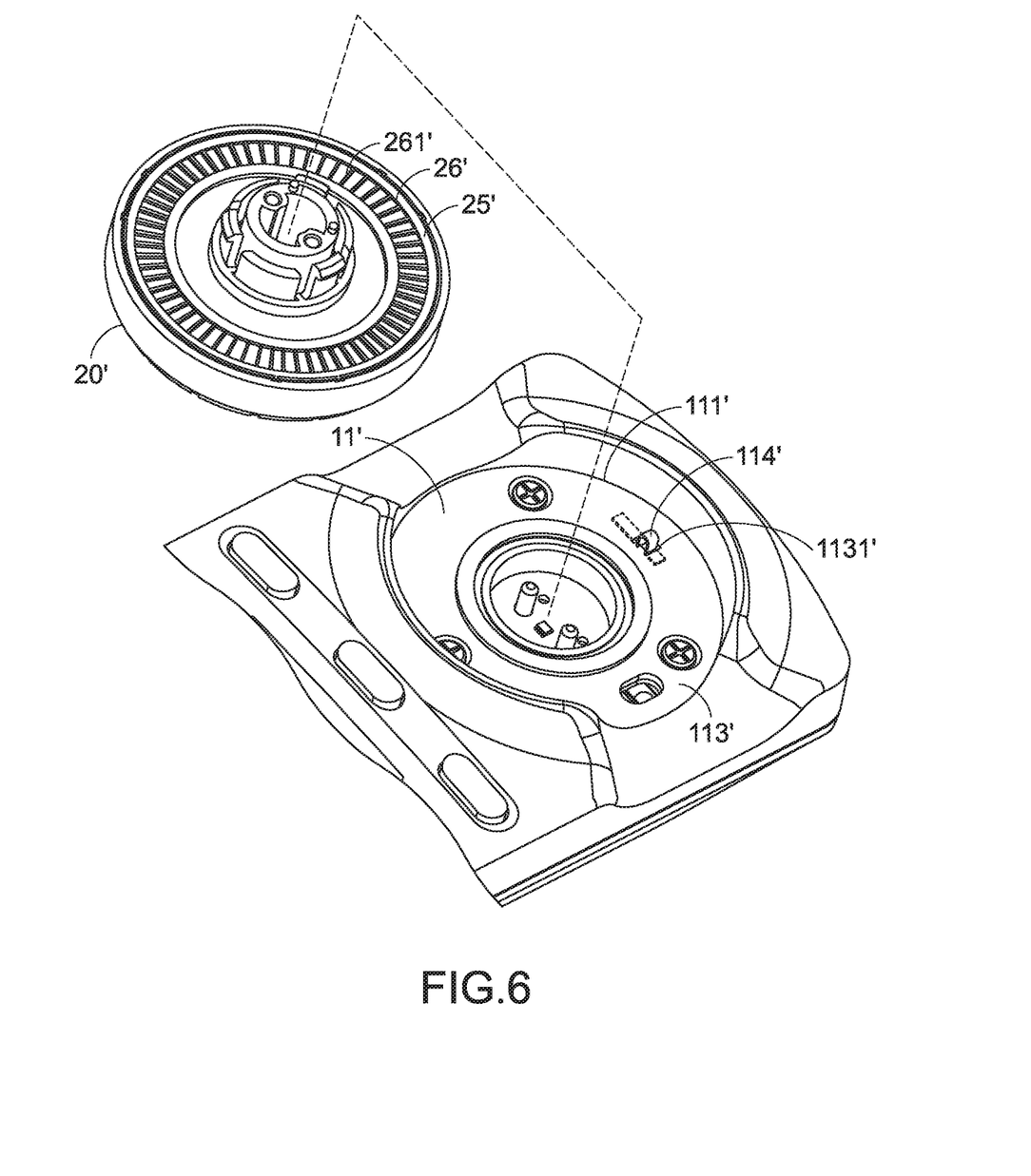
FIG. 6 is a schematic exploded view illustrating a control wheel according to a second embodiment of the present invention.

The present invention further provides a control wheel of a second embodiment. FIG. 6 is a schematic exploded view illustrating a control wheel according to a second embodiment of the present invention. The operations and components of the control wheel of the second embodiment that are similar to those of the first embodiment are not redundantly described herein. In this embodiment, the wheel ring 20' comprises an annular track 26'. The annular track 26' comprises plural ribs 261'. The annular track 26' is annularly formed on the bottom surface 25' of the wheel ring 20'. Moreover, the accommodation structure 11' further comprises a resilience element 114'. The resilience element 114' is disposed on the base 111' of the accommodation structure 11' and protruded in the direction toward the wheel ring 20'. The covering plate 113' further comprises a perforation 1131'. The perforation 1131' is in communication with the base 111' of the accommodation structure 11' and the wheel ring 20'. The resilience element 114' is penetrated through the perforation 1131' of the covering plate 113' and contacted with the bottom surface 25' of the wheel ring 20'. While the wheel ring 20' is rotated, the resilience element 114' is contacted with the ribs 261' of the annular track 26' successively, and the resilience element 114' is subjected to elastic vibration. Consequently, while the wheel ring 20' is rotated, the vibrating tactile feel is generated.

In the second embodiment, the ribs 261' of the annular track 26' are transverse strip-like ribs, and the resilience element 114' is an elastic arm.

Figure 7:
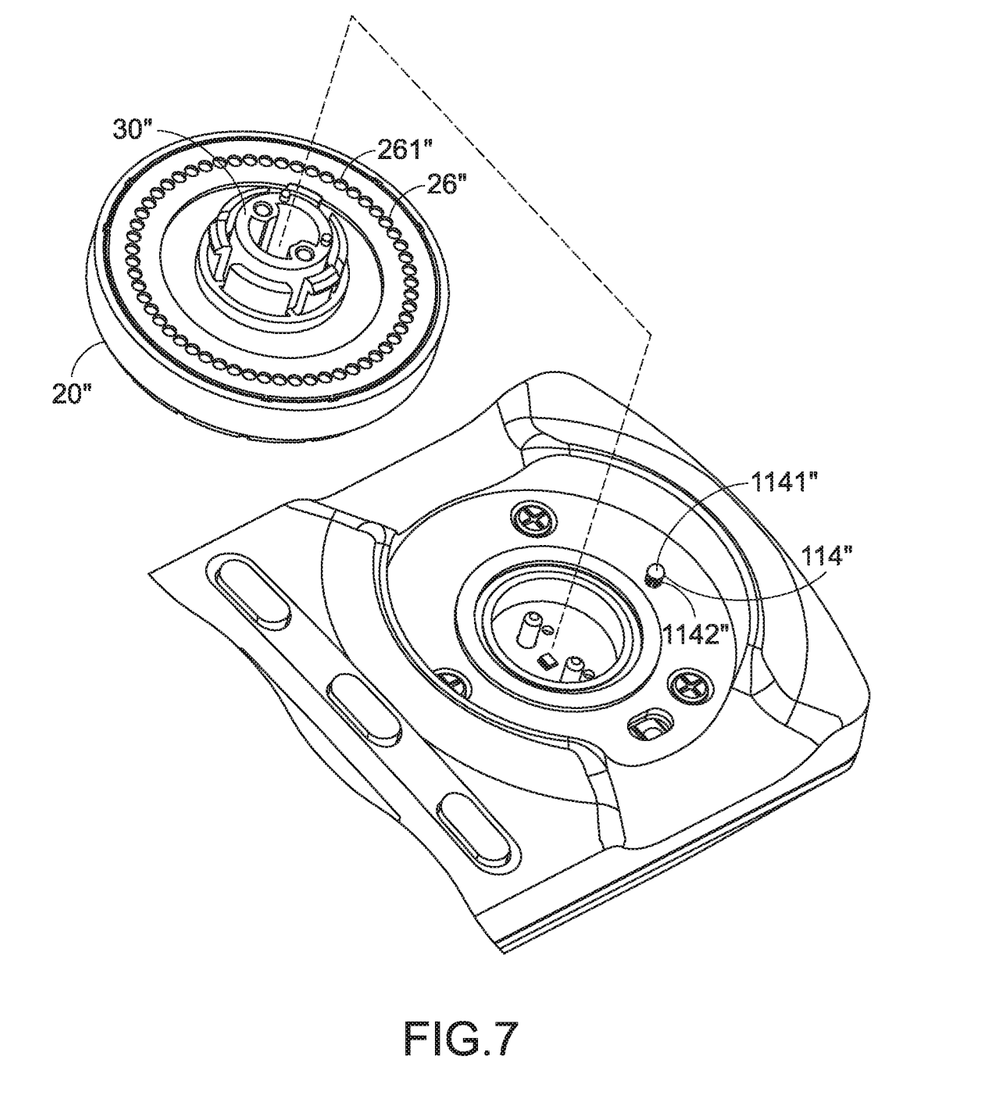
FIG. 7 is a schematic exploded view illustrating a control wheel according to a third embodiment of the present invention.

The present invention further provides a control wheel of a third embodiment. FIG. 7 is a schematic exploded view illustrating a control wheel according to a third embodiment of the present invention. The operations and components of the control wheel of the third embodiment that are similar to those of the second embodiment are not redundantly described herein. In the second embodiment, plural ribs 261' are formed on the annular track 26' of the wheel ring 20'. In comparison with the second embodiment, the annular track 26" of the wheel ring 20" in the third embodiment comprises plural circular holes 261" to replace the ribs. The plural circular holes 261" are discretely arranged side by side and arranged around the pivotal shaft 30". That is, the plural circular holes 261" are arranged around the periphery region of the pivotal shaft 30". The resilience element 114" comprises a ball 1141" and a spring 1142". The ball 1141" of the resilience element 114" is aligned with one of the plural circular holes 261". The spring 1142" of the resilience element 114" can assist in the elastic upward/downward movement of the ball 1141", and thus the ball 1141" can be returned to its original position. While the wheel ring 20" is rotated, the ball 1141" of the resilience element 114" is contacted with the circular holes 261" of the annular track 26" successively. Due to the elastic upward/downward movement of the ball 1141", and the resilience element 114" is subjected to elastic vibration. Consequently, while the wheel ring 20" is rotated, the vibrating tactile feel is generated.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A control wheel, comprising:
a casing comprising an accommodation structure and a concave structure, wherein the accommodation structure and the concave structure are located adjacent to each other, and the accommodation structure comprises a base;
a wheel ring disposed within the accommodation structure, and comprising a top surface, a lateral surface and a first magnetic element, wherein the lateral surface is arranged around the top surface and exposed outside through the concave structure of the casing, and the first magnetic element is disposed within the wheel ring;
a pivotal shaft disposed within the wheel ring and connected with the base of the accommodation structure, wherein the wheel ring is rotatable relative to the pivotal shaft; and
a second magnetic element disposed within the base of the accommodation structure,
wherein the lateral surface of the wheel ring is exposed outside through the concave structure of the casing,
wherein the first magnetic element of the wheel ring and the second magnetic element are magnetically attracted by each other, so that a rotating speed of the wheel ring is decreased,
wherein the accommodation structure of the casing further comprises a first opening, wherein the top surface of the wheel opening is aligned with the first opening, and the top surface of the wheel ring is exposed outside through the first opening.

2. The control wheel according to claim 1, wherein the concave structure of the casing comprises a second opening, wherein the lateral surface of the wheel ring is aligned with the second opening, and the lateral surface of the wheel ring is exposed outside through the second opening.

3. The control wheel according to claim 1, wherein the wheel ring further comprises a support part, wherein the support part is disposed within the wheel ring, and the first magnetic element is disposed within the support part.

4. The control wheel according to claim 3, wherein the support part comprises an annular groove, and the first magnetic element is disposed within the annular groove.

5. The control wheel according to claim 1, wherein a recess is formed in the base of the accommodation structure, and the second magnetic element is disposed within the recess.

6. A control wheel, comprising:
a casing comprising an accommodation structure and a concave structure, wherein the accommodation structure and the concave structure are located adjacent to each other, and the accommodation structure comprises a base;
a wheel ring disposed within the accommodation structure, and comprising a top surface, a lateral surface and a first magnetic element, wherein the lateral surface is arranged around the top surface and exposed outside through the concave structure of the casing, and the first magnetic element is disposed within the wheel ring, wherein the wheel ring further comprises a bottom surface and an annular track, wherein the bottom surface of the wheel ring is aligned with the base of the accommodation structure, and the annular track of the wheel ring is disposed on the bottom surface;
a pivotal shaft disposed within the wheel ring and connected with the base of the accommodation structure, wherein the wheel ring is rotatable relative to the pivotal shaft; and
a second magnetic element disposed within the base of the accommodation structure,
wherein the late surface of the wheel ring exposed outside through the concave structure of the casing,
wherein the first magnetic element of the wheel ring and the second magnetic element are magnetically attracted by each other, so that a rotating speed of the wheel ring is decreased.

7. The control wheel according to claim 1, wherein the accommodation structure further comprises a resilience element, wherein the resilience element is disposed on the base of the accommodation structure and protruded in a direction toward the wheel ring.

8. A control wheel, comprising:
a casing comprising an accommodation structure and a concave structure, wherein the accommodation structure and the concave structure are located adjacent to each other, and the accommodation structure comprises a base, wherein the accommodation structure further comprises a covering plate, wherein the covering plate is disposed on the base of the accommodation structure;
a wheel ring disposed within the accommodation structure, and comprising a top surface, a lateral surface and a first magnetic element, wherein the lateral surface is arranged around the top surface and exposed outside through the concave structure of the casing, and the first magnetic element is disposed within the wheel ring;

a pivotal shaft disposed within the wheel ring and connected with the base of the accommodation structure, wherein the wheel ring is rotatable relative to the pivotal shaft; and a second magnetic element disposed within the base of the accommodation structure, and wherein the second magnetic element is covered by the covering plate, wherein the lateral surface of the wheel ring is exposed outside through the concave structure of the casing, wherein the first magnetic element of the wheel ring and the second magnetic element are magnetically attracted by each other, so that a rotating speed of the wheel ring is decreased.

9. The control wheel according to claim 8, wherein the covering plate of the accommodation structure further comprises a perforation, and the perforation is in communication with the base of the accommodation structure and the wheel ring.

\* \* \* \* \*